United States Patent [19]

Henry et al.

[11] Patent Number: 4,570,172
[45] Date of Patent: Feb. 11, 1986

[54] LIGHT EMITTING DIODE WITH SURFACE EMISSION

[75] Inventors: Raymond Henry, Fontenay-aux-Roses; Jean C. Carballes, Gif-sur-Yvette; Guy Mesquida, Orsay, all of France

[73] Assignee: Thomson-CSF, Paris, France

[21] Appl. No.: 563,247

[22] Filed: Dec. 19, 1983

[30] Foreign Application Priority Data

Dec. 21, 1982 [FR] France .................. 82 21402

[51] Int. Cl.⁴ .......................... H01S 3/18; H01S 3/19; H01L 33/00
[52] U.S. Cl. ........................... 357/17; 357/16; 357/61; 372/45
[58] Field of Search ............... 357/16, 17, 61; 372/45

[56] References Cited

U.S. PATENT DOCUMENTS

| | | | |
|---|---|---|---|
| 3,946,417 | 3/1976 | Jacobus, Jr. et al. | 357/17 |
| 4,280,107 | 7/1981 | Scifres et al. | 357/17 |
| 4,319,259 | 3/1982 | Oshima et al. | 357/17 |
| 4,338,577 | 7/1982 | Sato et al. | 372/36 |

FOREIGN PATENT DOCUMENTS

| | | | |
|---|---|---|---|
| 2390017 | 5/1978 | France . | |
| 0109387 | 7/1982 | Japan | 357/17 |
| 1385634 | 2/1975 | United Kingdom | 357/16 |
| 2087145 | 5/1982 | United Kingdom . | |
| 2092370 | 8/1982 | United Kingdom . | |
| 2099624 | 12/1982 | United Kingdom | 372/45 |

Primary Examiner—James W. Davie
Assistant Examiner—Vangelis Economou
Attorney, Agent, or Firm—Oblon, Fisher, Spivak, McClelland & Maier

[57] ABSTRACT

A light emitting diode (LED) is provided which has light emission taking place through the surface of a window layer and which consist of at least one active layer between a substrate and a window layer. Under biassing, the active layer emits isotropic radiation of wave length λ. The LED of the invention comprises a re-emitting layer which absorbs the part of the radiation which is emitted in the direction of the substrate and re-emits it isotropically with a wave length very close to that of the active layer. For that, the re-emitting layer is made from a material whose prohibited band height is very close to but less than that of the active layer. If the substrate is transparent, it may be situated between the emitting layer and the re-emitting layer.

7 Claims, 8 Drawing Figures

LIGHT EMITTING DIODE WITH SURFACE EMISSION

BACKGROUND OF THE INVENTION

1. Field of the Invention

The present invention relates to a light emitting diode with surface emission whose structure is adapted for supressing the radiation re-emitted by the substrate.

A light emitting diode in accordance with the invention comprises a re-emitting layer made from a material close to that of the emitting layer, the re-emitting layer absorbing the energy directed towards the substrate so as to re-emit it at a wave length close to that of the emitting layer.

2. Description of the Prior Art

A light emitting diode is a component formed essentially by an active layer and at least one confinement layer; the whole is supported by a substrate and may further comprise other layers for smoothing, making contact . . . etc, which will not be described in detail in the rest of this text, for they do not come into the study of the invention. A light emitting diode uses the spontaneous emission from the radiative recombination of electron-hole pairs created by the injection of carriers into a forward biased junction. The spontaneous radiation is isotropic.

Two cases occur.

In a light emitting diode with surface emission, whose substrate is opaque to the emitted wave length, the optical spectrum associated with the emission comprises one or two more or less distinct peaks depending on the nature of the active layer. One of the peaks comes from the substrate which absorbs the energy emitted by the active layer and re-emits it at a wave length different from that of the active layer.

If, on the other hand, the substrate is transparent to the emitted wave length, it does not re-emit since it does not absorb, but about a half of the emitted light is lost: that which exits through the rear face of the diode, i.e. through the substrate.

Because of the substantially lambertian distribution of the emitted beam, the efficiency of a light emitting diode is rather mediocre, especially when coupled with an optical fiber. In order to increase the efficiency of a light emitting diode and so as to obtain a purer spectrum, the invention provides for the addition to the structure of the light emitting diode of a layer, placed in the rear path of the emitted light, of a nature very close to that of the active layer, but with forbidden band energy less than those of the confinement layers and of the active layer: this additional layer absorbs the radiation emitted at a wave length $\lambda$ by the active layer and re-emits it by photoluminescence at a wave length very close to $\lambda + \Delta\lambda$. Thus, the optical power emitted is increased by the photoluminescent emission, and the optical spectral line is slightly increased, but the parasite emission peak by the substrate is considerably reduced, even cancelled out in some cases.

SUMMARY OF THE INVENTION

More precisely, the invention relates to a light emitting diode with surface emission, comprises at least one active layer situated between a substrate and a window layer, the active layer emitting, under biasing, an isotropic light radiation one part of which is emitted through the window layer and a part is emitted towards the substrate, this diode being characterized in that a layer, formed from a material whose forbidden band height is close to but less than the forbidden band height of the material of the active layer, absorbs the radiation emitted towards the substrate and re-emits it isotropically by photoluminescence at a wave length $(\lambda + \Delta\lambda)$ very close to the wave length $(\lambda)$ of the active layer.

BRIEF DESCRIPTION OF THE DRAWINGS

The invention will be better understood from the following description of two embodiments, concerning the two cases where the substrate is opaque and where the substrate is transparent at the emitted wave length, this description referring to the accompanying figures which show.

DESCRIPTION OF THE PREFERRED EMBODIMENTS

There exists a large number of types of light emitting diodes, which vary according to their structure or the materials forming them. A light emitting diode may have a homojunction, a single or double heterojunction, and it may be made from different materials such as those of the families GaAs, AlGaAs, InP, InGaAs, InGasP, . . . etc. In oder to be more precise in the description of the invention, two cases will be taken: that of a GaAs-AlGaAs diode whose GaAs substrate is opaque to the radiation, close to 840 nanometers, and that of a diode whose InP substrate is transparent to the radiation, close to 1,300 nanometers.

Figure 1:
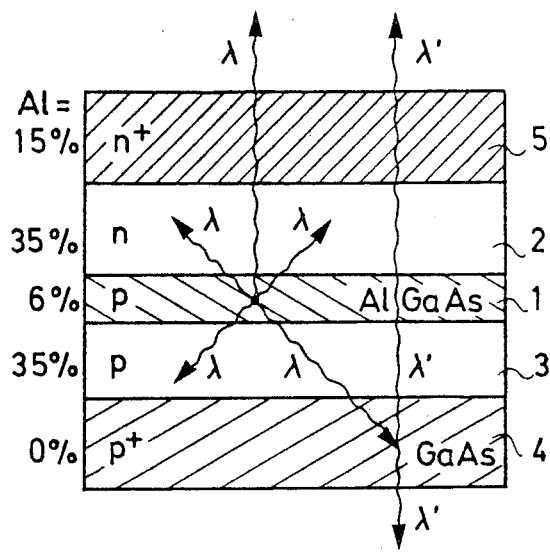
FIG. 1: a sectional view of a light emitting diode of the Prior Art, in the case of an opaque substrate.

FIG. 1 shows a sectional view of a light emitting diode of the Prior Art. This is essentially formed by a layer 1, so called active layer, sandwiched between two confining layers 2 and 3 and forming therewith, at the two interfaces, two heterojunctions. In the simplest cases, this diode is completed by at least one substrate 4, which serves both as mechanical support for the fine layers deposited from the substrate, and as first electric contact, and further by a surface layer 5, so called window layer, intended for making a second electric contact and transparent to emitted radiation. The active layer 1 is made from $Al_xGa_{1-x}As$, with type p doping, comprising 6% aluminium. The two confinement layers 2 and 3 are both made from $Al_{x'}Ga_{1-x'}As$, comprising 35% aluminium, the confinement layer 2 situated between the active layer 1 and the emissive surface of the diode being of type n doping, whereas the confinement layer 3 situated between the active layer 1 and substrate 4 is of type p doping. Substrate 4 being made from GaAs of type $p^+$, it therefore comprises 0% aluminium.

Finally, the contact making layer 5, which forms the output window for the radiation and the emissive surface of the diode, as opposed to the opaque surface of substrate 4, is made from $Al_{x''}Ga_{1-x''}As$, of n+ type doping and comprising 15% aluminium.

The aluminium content in a layer sets a prohibited band height of said layer and consequently imposes the emission wave length proper to the layer. With a light emitting diode operating under spontaneous emission conditions, the radiation of each emissive point takes place isotropically in space, which is shown in FIG. 1 in the form of radiation which, from a volume element of the active layer 1, is propagated in every direction in space. The confinement layers 2 and 3 and the window layer 5, since they have aluminium concentrations greater than those of the active layer 1 which only comprises 6% thereof, are transparent to the radiation of this active layer. Consequently, from a volume element of the active layer 1, a part of the radiation of wave length λ exits through the window layer 5, a part is lost laterally with respect to the structure of the light emitting diode and a part strikes the GaAs substrate opaque to this wave length λ.

The part of the radiation reaching the substrate 4 is absorbed thereby and the energy loss associated with this absorption allows re-emission by the GaAs substrate, by photoluminescence, at a wave length proper to the substrate, i.e. in the chosen example close to 880 nanometers. A part of the emission from the substrate, at its own wave length λ', passes through the diode without being absorbed either by the active layer or by the confinement layers and so leaves through the window layer 5 which means that, during spectral analysis of the light emitting component, the wave length λ' proper to the substrate is taken into account with the wave length λ proper to the active layer.

Figure 2:
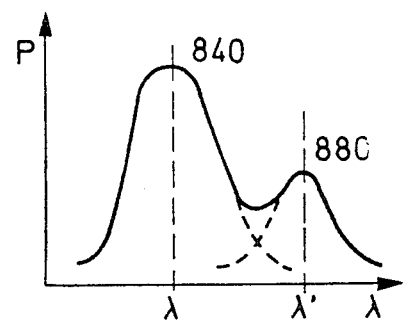
FIG. 2: the energy spectrum of the preceding light emitting diode.

FIG. 2 shows the optical power of the light emitting diode, plotted as ordinates, with respect to the wave length plotted as abscissa. It shows that, for a diode of the GaAs-AlGaAs, type, there is a power peak close to 840 nanometers, and a smaller power peak close to 880 nanometers, which corresponds to the power emitted by photoluminescence by the substrate. The envelope of these two peaks gives the spectral analysis of the component. The parasite peak at 880 nanometers may represent up to 40% of the optical power of the main peak at 840 nanometers. This spectral duality may compromise use of the light emitting diode in a number of applications, in particular those in which wave length multiplexing is used: in these applications, it is necessary for the spectral line width to be the smallest possible and for it to be defined as well as possible. Now, as a general rule, the parasite emission phenomenon increases the width of the spectra of the diodes obtained in the Prior Art: the parasite emission must therefore be suppressed.

Figure 3:
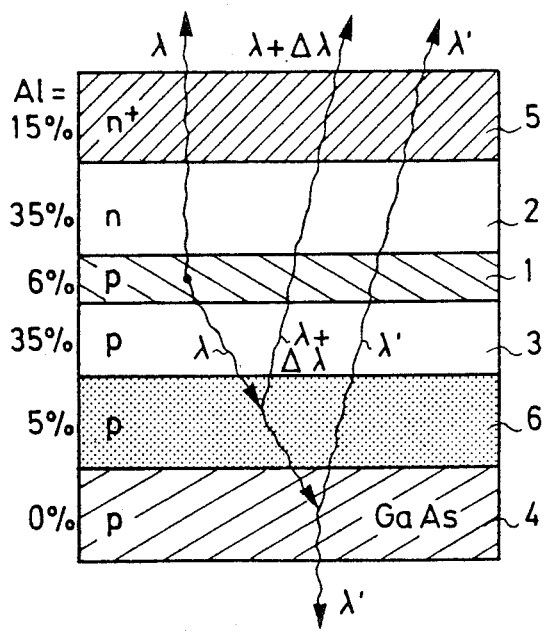
FIG. 3: a sectional view of a light emitting diode in accordance with the invention, in the case of an opaque substrate.

FIG. 3 shows a sectional view of a light emitting diode in accordance with the invention, in the case of an opaque substrate. With respect to the light emitting diode section of the Prior Art shown in FIG. 1, the diode of the invention comprises, placed between the substrate 4 and the confinement layer 3 which is closest to the substrate, an additional $Al_yGa_{1-y}As$ layer 6, of type p conductivity and containing 5% aluminium. Generally, the percentage of aluminium in the re-emitting layer 6 must be as close as possible to the percentage of aluminium in the emitting layer 1, but very slightly less, so that the forbidden band of the re-emitting layer is very close to the prohibited band of the emitting layer 1 and in any case less than the prohibited band of the confinement layer 3.

In a structure in accordance with the invention, a volume element of the emitting layer 1 emits light at wave length λ in the direction of the window layer 5 but also, among others, in the direction of substrate 4: the radiation which is directed towards the substrate is, for a sufficient layer thickness, absorbed by the re-emitting layer 6 and re-emitted by photoluminescence. Thus, from the re-emitting layer 6, photoluminescent radiation of wave length λ+Δλ very close to the wave length λ of the emitting layer 1 is partly propagated towards the window layer 5 and partly towards the substrate. The part of this radiation λ+Δλ which is absorbed by the substrate 4 is in its turn re-emitted isotropically at the parasite wave length λ'.

Figure 4:
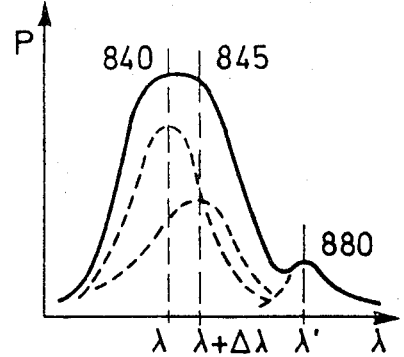
FIG. 4: an energy spectrum of the light emitting diode of FIG. 3.

FIG. 4 shows the optical power curve of a diode in accordance with the invention, as a function of the wave length. With respect to the curve of FIG. 2, which shows the optical power of a diode of the Prior Art, the main optical power peak is very slightly widened for it is now formed by the sum of two peaks: the one which corresponds to the emission of the active layer 1, i.e. in the present case the 840 nanometer peak, and the one which corresponds to re-emission by photoluminescence of the re-emitting layer 6, i.e. in this case of the order of 845 nanometers. The envelope, or more exactly the sum of these two energy peaks, allows a main power peak to be obtained which is larger than that of the active layer alone, at a price of a slight flattening of the peak top since it is very slightly widened by the light re-emitted by photoluminescence.

Moreover, and in a context totally independent of the photoluminescence, the presence of the re-emitting layer 6 brings an advantage in that it serves as smoothing layer on the substrate and allows the growth of the first GaAlAs confinement layer to be better adapted on the GaAs substrate, thus minimizing possible stresses and blocking, during epitaxy, the migration of defects in the substrate to the layers.

Figure 5:
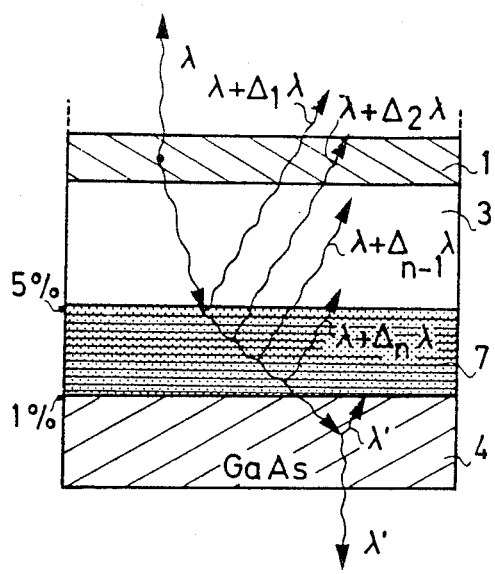
FIG. 5: a sectional view of a light emitting diode in accordance with the invention in a first variant.

FIG. 5 shows a sectional view of a light emitting diode in accordance with the invention, in a variant which further emphasises this advantage. Only the lower part, mainly the part of the diode between the active layer and the substrate is shown so as to simplify the Figure.

In this variant of the invention, the re-emitting layer is no longer, as in the case of FIG. 3, formed by a single layer 6 of homogeneous material, but is formed by an assembly 7 of fibre layers, each layer having an aluminium content, or more generally a forbidden band, which varies continuously from the substrate in the direction of the active layer 1. More concretely, and still in the case where the substrate is made from GaAs opaque at 840 nanometers, the first layer situated in contact with the substrate comprises 1% aluminium, the second layer 2% and so on up to the last layer which comprises 5% aluminium, if the active layer 1 comprises 6%.

According to this diode structure the radiation emitted by a volume element of the active layer 1, at a wave length λ, towards the GaAs substrate 4 is absorbed by the last of the layers forming the emitting layer 7, namely the layer which is in contact with the confinement layer 3. The radiation absorbed in this re-emitting layer is then re-emitted by photoluminescence at a wave length λ+Δ₁λ, corresponding to the aluminium content in said layer. The radiation of wave length λ+Δ₁λ, which is itself emitted isotropically in all directions is in its turn absorbed by the next layer and re-emitted at a wave length $\lambda + \Delta_2\lambda$ and so on as far as the first layer in contact with the substrate, which re-emits at a wave length $\lambda + \Delta_n\lambda$. The substrate itself receives a certain radiation which is in fact a mixture of the radiations of the active layer and of the emitting layer 7 but only re-emits a very small part at a parasite wave length $\lambda'$.

Figure 6:
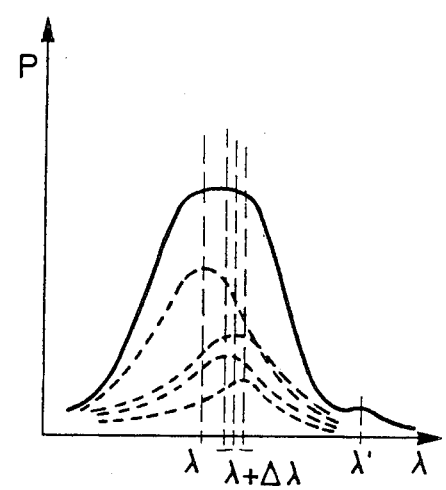
FIG. 6: the energy spectrum of the light emitting diode of FIG. 5.

FIG. 6 shows the energy spectrum of a light emitting diode according to this first variant of the invention. By comparison with the spectrum of FIG. 4, the main energy peak is very slightly widened because it is no longer obtained by the association alone of an energy peak corresponding to the active layer 1 and a single energy peak corresponding to the re-emitting layer 6, but it is obtained by association of the energy peak of the emitting layer 1 with a plurality of small energy peaks of the re-emitting sub-layers 7. On the other hand, the parasite energy peak at 880 nanometers has practically disappeared.

Figure 7:
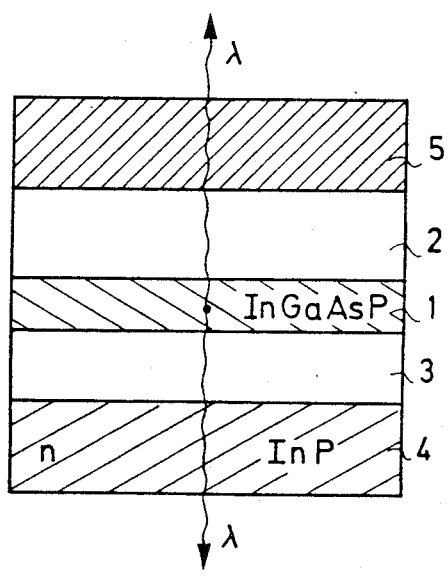
FIG. 7: a sectional view of the light emitting diode of the Prior Art, in the case of a transparent substrate.

FIG. 7 shows a sectional view of a light emitting diode according to the Prior Art, in the second case, in which the substrate is transparant to the emitted wave length.

This type of diode is essentially formed by an active layer 1 made from $Ga_xIn_{1-x}As_yP_{1-y}$ for example, limited by a double heterojunction between two confinement layers 2 and 3 which are both made from InP, the whole being supported a substrate 4 also made from InP. The light emitted by the active layer when it is polarised leaves through window 5, on the upper face of the light emitting diode, but also leaves through the InP substrate 4 since this latter is transparent. In the case where the diode is an association between the InP and InGAsP layers, or other closely related materials, the emitted wave length is close to 1,300 nanometers. Between 1200 and 65,000 nanometers, x and y in the $Ga_x$-$In_{1-x}As_yP_{1-y}$ compound are related by the relationship:

$$x = 0.189y/(0.4184 - 0.134y)$$

with $0.5 < y < 1$ and $0.22 < x < 0.47$.

A diode emitting at 1,300 nanometers, of a kind shown in FIG. 7, may be adapted and receive a structure in accordance with the invention such as the structure shown in FIG. 3 and its variant in FIG. 5. In this case, between the substrate and the confinement layer 3—the one which is situated between the active layer 1 and substrate 4—there must be disposed a re-emitting layer which may be either uniform in its thickness and without doping gradient, such as layer 6 in FIG. 3, or which may be formed by a succession of fine layers having a doping gradient such as shown at 7 in FIG. 5. The important thing is that the re-emitting layer should have a forbidden band slightly lower than that of the active layer.

However, and solely in the case were the substrate is transparent to the emitted wave length, a second case may be interesting. This is the one shown in FIG. 8.

Figure 8:
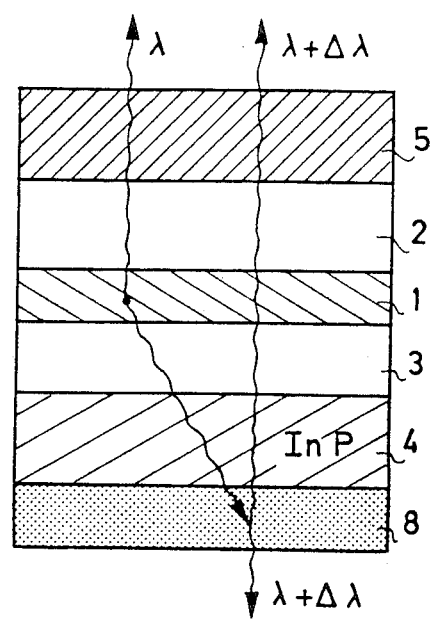
FIG. 8: a sectional view of a light emitting diode according to the invention in the case of a transparent substrate.

The difference existing between the structure of FIG. 8 and the structure of FIG. 3 is that the re-emitting layer is situated, at 8 in FIG. 8, behind the substrate, seen from the active layer, whereas in the structure FIG. 3 the re-emitting layer 6 was situated in front of the substrate, seen from the emitting layer.

In the case where the re-emitting layer 8 is situated behind the substrate, the light emitted by a volume element of the active layer passes through the confinement layer 3 and substrate 4 before being absorbed by the re-emitting layer 8. This latter transforms the absorbed energy and re-emits it in the form of a radiation of wave length very close to $\lambda + \Delta\lambda$, but, since the re-emitting layer is situated outside the structure, the radiation re-emitted by photoluminescence is directed partly to the window layer 5, which is one of the objectives originally sought, but also partly to the rear part of the light emitting diode. The fact that radiation exits through the rear part of the light emitting diode is, in some cases, desirable so as to be able to control the light emitted by a diode and to ensure for example feedback depending on this emitted light.

The invention has been described with respect to the two cases the most current at the present time, at 840 and 1300 nanometers, which also correspond to two interesting cases where the substrate is either opaque or transparent. Nevertheless, the invention applies to all light emitting diodes, whatever the materials from which they are formed, binary or ternary alloy of the families III-V. The invention also applies to all light emitting diodes whatever their structure: so as to simplify the description, the structure of the diodes has been voluntarily simplified by omitting a number of auxilliary layers which have their use but which do not come into the description of the invention. The invention also applies to the case of diodes which only comprise a homojunction, or a simple heterojunction and not a double heterojunction. The general principle of the invention is to replace the part situated on the substrate side in a diode, and which either lets the light escape through the rear face or absorbs it completely, by what could be compared to a re-emitter, the re-emitting layer, characteristic of the invention, absorbing the light emitted towards the substrate, and re-emitting it towards the window at a wave length very close to that of the active layer. More generally, the invention is stated precisely in the following claims.

We claim:

1. In a light emitting diode with surface emission, comprising:
    a substrate;
    a window layer transparent to radiation;
    at least one active layer situated between said substrate and said window layer wherein said at least one active layer emits, under polarization, isotropic light radiation wherein one part of said isotropic light radiation is emitted through said window layer and another part of said isotropic light radiation is emitted towards said substrate;
    a re-emitting layer, formed by a material whose forbidden band height is close to but less than the forbidden band height of the material of said active layer, wherein said re-emitting layer absorbs said another part of said isotropic light radiation emitted in the direction of said substrate and wherein said re-emitting layer re-emits said another part of said light radiation isotropically by photoluminescence at a wavelength very close to the wavelength of said active layer.

2. The light emitting diode as claimed in claim 1, further comprising at least one confinement layer situated between said active layer and said substrate, said re-emitting layer being situated between the confinement layer and the substrate and being of homogeneous composition over the whole of its thickness.

3. The light emitting diode as claimed in claim 1, wherein, with the diode comprising at least one confinement layer situated between said active layer and said substrate, the re-emitting layer is situated between said confinement layer and said substrate and is formed of a plurality of sub-layers of variable composition, whose forbidden band height increases from the sub-layer in contact with the substrate as far as the sub-layer in contact with said confinement layer.

4. The light emitting diode as claimed in claim 2 or 3, wherein, with the substrate transparent to the wave length of the radiation emitted by said active layer, said substrate is situated between said confinement layer and the re-emitting layer, which emits a radiation for controlling or for the feedback operation of the diode.

5. The light emitting diode as claimed in claim 2 or 3, wherein:
- the substrate is made from p+ doped GaAs,
- the re-emitting layer is made from p type $Al_yGa_{1-y}As$, containing 5% Al ($y \simeq 0.05$),
- a first confinement layer is made from p type $Al_{x'}Ga_{1-x'}As$, containing 35% Al ($x' \simeq 0.35$),
- the active layer is made from p type $Al_xGa_{1-x}As$, containing 6% Al ($x \simeq 0.06$),
- a second confinement layer is made from n type $Al_{x'}Ga_{1-x'}As$, containing 35% Al ($x' \simeq 0.35$),
- the window layer is made from n+ type $Al_{x''}Ga_{1-x''}As$, containing 5% Al ($x'' \simeq 0.05$).

6. The light emitting diode as claimed in claim 2 or 3, wherein:
- the substrate is made from p+ doped GaAs,
- the re-emitting layer is made from p type $Al_yGa_{1-y}As$, formed by a plurality of sub-layers containing 1% (substrate side) to 5% (confinement layer side) of Al
- a first confinement layer is made from p type $Al_{x'}Ga_{1-x'}As$, containing 35% Al ($x' \simeq 0.35$),
- the active layer is made from p type $Al_xGa_{1-x}As$, containing 6% aluminium ($x \simeq 0.06$),
- a second confinement layer is made from n type $Al_{x'}Ga_{1-x'}As$, containing 35% Al ($x' \simeq 0.35$),
- the window layer is made from n+ type $Al_{x''}Ga_{1-x''}As$, containing 5% Al ($x'' \simeq 0.05$).

7. The light emitting diode as claimed in claim 2 or 3 wherein:
- the substrate is made from InP;
- the re-emitting layer is made from $Ga_xIn_{1-x}As_yP_{1-y}$;
- a first confinement layer is made from InP;
- the active layer is made from $Ga_xIn_{1-x}As_yP_{1-y}$;
- a second confinement layer is made from InP;
- the window layer is made from InP, with $0.22 \leq x \leq 0.47$ and $0.5 \leq y \leq 1$ for the two re-emitting and active layers.

* * * * *